United States Patent [19]

Miller

[11] Patent Number: 4,774,456

[45] Date of Patent: Sep. 27, 1988

[54] CURVE TRACER ACCESSORY DEVICE

[75] Inventor: Emmett L. Miller, Seattle, Wash.

[73] Assignee: The Boeing Company, Seattle, Wash.

[21] Appl. No.: 834,207

[22] Filed: Feb. 27, 1986

[51] Int. Cl.$^4$ ............................................. G01R 13/20
[52] U.S. Cl. ............................. 324/73 R; 324/158 T; 324/158 R
[58] Field of Search ............ 324/73 R, 158 T, 73 AT, 324/158 D, 158 R, 121 R; 371/20, 25

[56] References Cited

U.S. PATENT DOCUMENTS

| | | | |
|---|---|---|---|
| Re. 20,945 | 12/1938 | Bedell | 171/95 |
| 2,221,115 | 11/1940 | Shepard, Jr. | 171/95 |
| 2,858,475 | 10/1958 | Blake | 315/26 |
| 3,076,140 | 1/1963 | Smith | 324/158 |
| 3,323,059 | 5/1967 | Erickson et al. | 324/158 |
| 3,534,155 | 10/1970 | Rhodes | 178/5.4 |
| 3,573,618 | 4/1971 | Dilley | 324/158 |
| 4,001,818 | 1/1977 | Radichel et al. | 324/73 AT X |
| 4,097,797 | 6/1978 | Finet | 324/73 R X |
| 4,163,937 | 8/1979 | Laass | 324/158 D |
| 4,257,043 | 3/1981 | Tsuchiko | 340/722 |
| 4,482,861 | 11/1984 | Jalovec et al. | 324/77 |

FOREIGN PATENT DOCUMENTS 1269718  6/1968  Fed. Rep. of Germany.

OTHER PUBLICATIONS

"577/177 Curve Tracers"; Tektronix, Inc.; 1976 p. 5.
Ian Pogson, "Oscilloscope Switch" Electronics Australia, vol. 43, No. 2, pp. 40-47, Feb., 1981.
Ian Pawson, "Scope Trace Doubler for TV Use", Television, vol. 28, No. 9, pp. 468-469, Jul., 1978.

Primary Examiner—Reinhard J. Eisenzopf
Assistant Examiner—Vinh P. Nguyen
Attorney, Agent, or Firm—Christensen, O'Connor, Johnson & Kindness

[57] ABSTRACT

An accessory device for use with a curve tracer to permit the simultaneous display of current-voltage characteristics of test and reference devices. The accessory device is adapted to connect to a curve tracer having first, second and third terminals, and including as an output on the second terminal, a step signal that cyclically takes on a plurality of voltage levels. The curve tracer must further display for each such voltage level, the voltage-current characteristic of a circuit connected between the first and third terminals. The accessory device is plug-connected to these terminals. A device selector on the accessory device is thus connected to receive the step signal, and alternately connects the first terminal to either the test device or reference device in synchronization with the step signal. The third terminal is electrically connected to both the test and reference devices. Pin selector switching is provided on the accessory device to select a pair of pins on the test device for connection in a first circuit path between the device selector and the third terminal, and to correspondingly select an identical pair of pins on the reference device for connection in a second circuit path between the device selector and the third terminal.

21 Claims, 4 Drawing Sheets

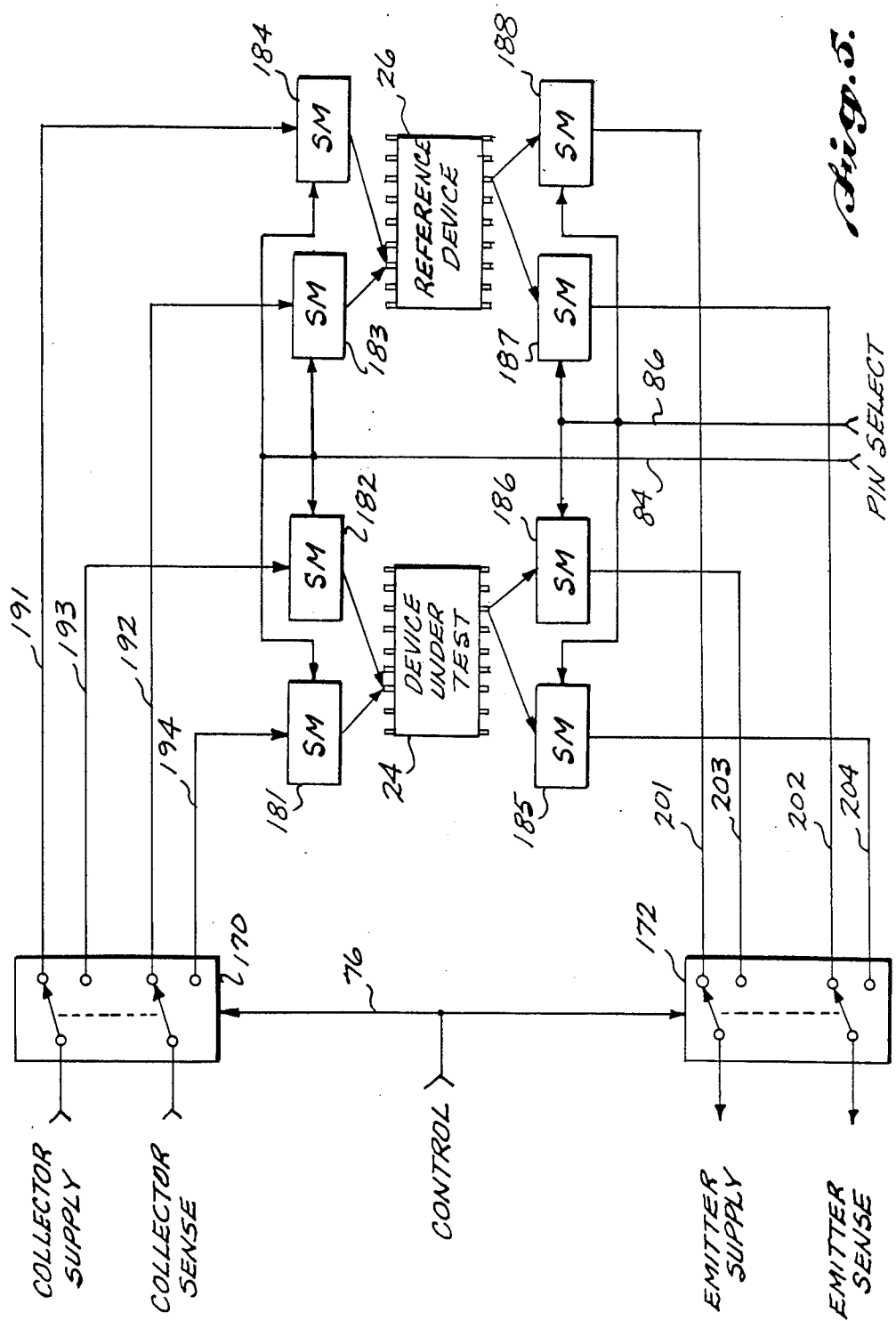

CURVE TRACER ACCESSORY DEVICE

FIELD OF THE INVENTION

The present invention relates to curve tracers, and in particular to accessory devices for extending the capability of curve tracers for comparing a device under test to a reference device.

BACKGROUND OF THE INVENTION

A curve tracer is an oscilloscope-like instrument that includes a display screen and at least three terminals that may be generally designated the collector, base and emitter terminals. The respective pins of a transistor can be connected to these three terminals, and the curve tracer will display a graph on the display screen showing the current flowing between the collector and emitter terminals (vertical axis) versus the voltage between such terminals (horizontal axis) for a series of base voltages. The base voltages are supplied by the curve tracer at its base terminal, and may be stepped in a selected manner. For example, the curve tracer can be controlled via switches on its front panel to cyclically step the base voltage from zero to 2.5 volts in 0.5 volt increments, for a total of six steps per cycle. The steps occur during the retrace between successive video frames, such that each step corresponds to 1/60th of a second. A curve tracer thereby provides a device for rapidly and conveniently measuring and displaying a family of characteristic curves of a transistor or similar device, and for verifying that such transistor is in proper working condition.

A curve tracer can be used as a two-terminal device in which two pins or terminals of a device under test are connected to the collector and emitter terminals of the curve tracer. For example, if the device under test is a diode, the curve tracer will respond by displaying the characteristic voltage-current curve of a diode. A more common use of a curve tracer as a two-terminal device is to examine the variation of current with voltage for a selected pair of pins of an integrated circuit. However, when used in this manner to test an integrated circuit, it will generally not be apparent to the operator of the curve tracer what the correct or nominal voltage-current characteristic should be for a given pair of integrated circuit pins. Primarily for this reason, curve tracer adaptors have been developed that permit the curve tracer terminals to be manually switched back and forth between a device under test and a reference device. Thus an operator can manually toggle the display back and forth in an attempt to discern a difference between the characteristic curves of the test and reference devices. Assuming that the selected pins of the reference and test devices are within tolerance, the test procedure could be continued by switching the connections between the test and reference devices, such that a different pin combination of each device was connected to the curve tracer, and repeating the above procedure. Because this is a cumbersome and time-consuming process, curve tracers in the past have not been widely used to systematically screen integrated circuits for malfunctions.

SUMMARY OF THE INVENTION

The present invention provides an accessory device for use with a curve tracer. The accessory device permits the simultaneous display by the curve tracer of the current-voltage curves of test and reference devices, to permit small and subtle differences between such curves to be discerned by an operator. The switching back and forth between test and reference devices is synchronized to the signal at the base terminal of the curve tracer, and thereby with the frame rate of the curve tracer display. The present invention also provides for automatic, coordinated switching of different pin combinations of the test and reference devices into the circuit, to provide an instrument capable of rapidly and systematically testing an integrated circuit for a malfunction.

In one aspect, the present invention provides an accessory device for use in conjunction with a curve tracer for comparing the voltage-current characteristic of a test circuit with the voltage-current characteristic of a reference circuit. The curve tracer comprises first, second and third terminals, and means for providing a step signal at the second terminal such that the step signal cyclically takes on a plurality of voltage levels. The curve tracer also includes means for measuring and displaying, for each voltage level, the voltage-current characteristic of a device connected between the first and third terminals. The accessory device comprises device selection means connected to receive the step signal and operative to alternately connect the first terminal to either the test device or the reference device, the alternation between test and reference devices being synchronized with the step signal. The third terminal of the curve tracer is connected to both the test and reference circuits.

In a further aspect, the accessory device includes pin selection means adapted to receive a pin select signal representing a selected pin of the test circuit. The pin selection means includes switch means connected in series with the test circuit, such that a circuit path may be formed between the first and third terminals through the test circuit and the switch means. The switch means is responsive to the pin select signal for switching the selected pin into the circuit path. In a preferred embodiment, the pin selection means may comprise four switch means to permit automated, coordinated switching of selected pair of pins of the test and reference circuits into circuit paths between the first and third terminals.

In a further preferred embodiment, the device selection means includes means for producing a control signal that alternates between first and second states, such that the alternation between such states is synchronized with the step signal. The device selection means also includes means responsive to the control signal for connecting the first terminal to a first output terminal when the control signal is in its first state, and for connecting the first terminal to a second output terminal when the control signal is in its second state. The first and second output terminals are coupled to the test and reference devices respectively. The pin selection means may be connected to receive the control signal, and may include means for modifying the pin select signal, to thereby change the selected pin, for each N cycles of the control signal that are received, N being a preselected number greater than or equal to one.

In a further aspect, the present invention provides an accessory device for use in conjunction with a curve tracer having first, second, third, fourth and fifth terminals. The curve tracer provides a step signal at the third terminal such that the step signal cyclically takes on a plurality of voltage levels. The curve tracer measures and displays, for each voltage level, the current between the first and fourth terminals as a function of the voltage between the second and fifth terminals. The accessory device is connected to receive the step signal, and is operative to alternately connect the first, second and fifth terminals to either the test device or the reference device, the alternation between tests and reference devices being synchronized with the step signal. The accessory device further includes means for connecting the fourth terminal to the test and reference devices, and pin selection means adapted to receive a pin select signal representing a selected pin of the test circuit. The pin selection means includes sense switch means connected in series with the test circuit such that a sensing circuit path may be formed between the second and fifth terminals through the test circuit and sense switch means. The pin selection means also includes supply switch means connected in series with the test circuit such that a supply circuit path may be formed between the first and fourth terminals through the test circuit and supply switch means. The sense and supply switch means are both responsive to the pin select signal for switching the selected pin into the sense and supply circuit paths respectively.

BRIEF DESCRIPTION OF THE DRAWINGS

FIG. 5 is a block diagram of a second preferred embodiment of the invention using semiconductor switches.

DETAILED DESCRIPTION OF THE INVENTION

Figure 1:
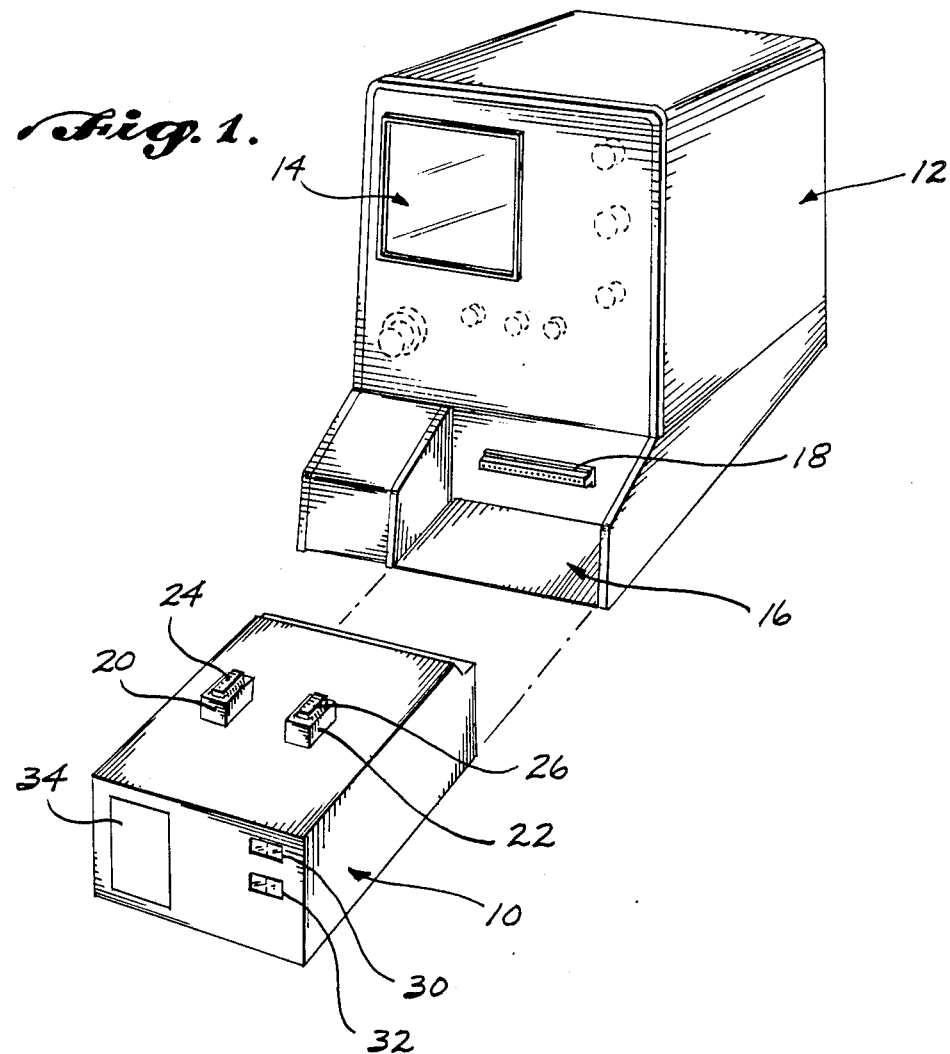
FIG. 1 is a perspective, pictorial view of a curve tracer and of the accessory device of the present invention.

Referring initially to FIG. 1, the present invention provides an accessory device 10 for use with curve tracer 12. Curve tracer 12 comprises display screen 14, and a set of conventional controls for setting the horizontal and vertical positions and scales, as well as for setting the base step signal as described below. Curve tracer 12 includes a recess 16 designed to receive an adaptor, and electrical connector 18 designed to electrically interface with an adaptor. In a typical curve tracer, connector 18 includes five terminals: a collector supply terminal; a collector sense terminal; an emitter supply terminal; an emitter sense terminal; and a base step generator terminal. The collector and the emitter supply terminals provide appropriate voltages and currents to the device being tested. The collector and the emitter sense terminals are adapted for sensing the voltage drop across the device. The curve tracer displays the current flowing through the collector and emitter supply terminals on the vertical axis of the display screen, and displays the voltage difference between the collector and emitter sense terminals on the horizontal axis of the display screen. For many applications, the collector and emitter sense terminals may not be directly connected to the test device, in which case the voltage drop between the collector and emitter supply terminals is displayed on the horizontal screen axis.

The base step generator terminal of the curve tracer is adapted to provide a base voltage signal consisting of a prescribed and repeating sequence of base voltages. When a three-terminal device such as a transistor is being tested, the base step signal may be coupled to the transistor base, resulting in a display of a family of characteristic curves for that transistor. The base step signal is used for an entirely different purpose in the adaptor of the present invention, as described below.

Accessory device 10 is designed to fit into recess 16 and to make electrical contact with the curve tracer via connector 18. The upper surface of accessory device 10 includes sockets 20 and 22 adapted for receiving device under test 24 and reference device 26. The front panel of accessory device 10 includes LED displays 30 and 32, and control panel 34 that comprises switches, potentiometers, or other conventional input devices for permitting an operator to control the accessory device. In general, the function of accessory device 10 is to cause the simultaneous display on display screen 14 of characteristic curves for device under test 24 and reference device 26, therefore permitting small differences between the test and reference devices to be readily detected. In the illustrated preferred embodiment, the display on display screen 14 at any particular time, comprises the characteristic curve of a selected pair of pins of the device under test and the characteristic curve of the identical pair of pins of the reference device. The selected pin pair is displayed via LED displays 30 and 32. Methods for controlling the pin selection are described below.

Figure 2:
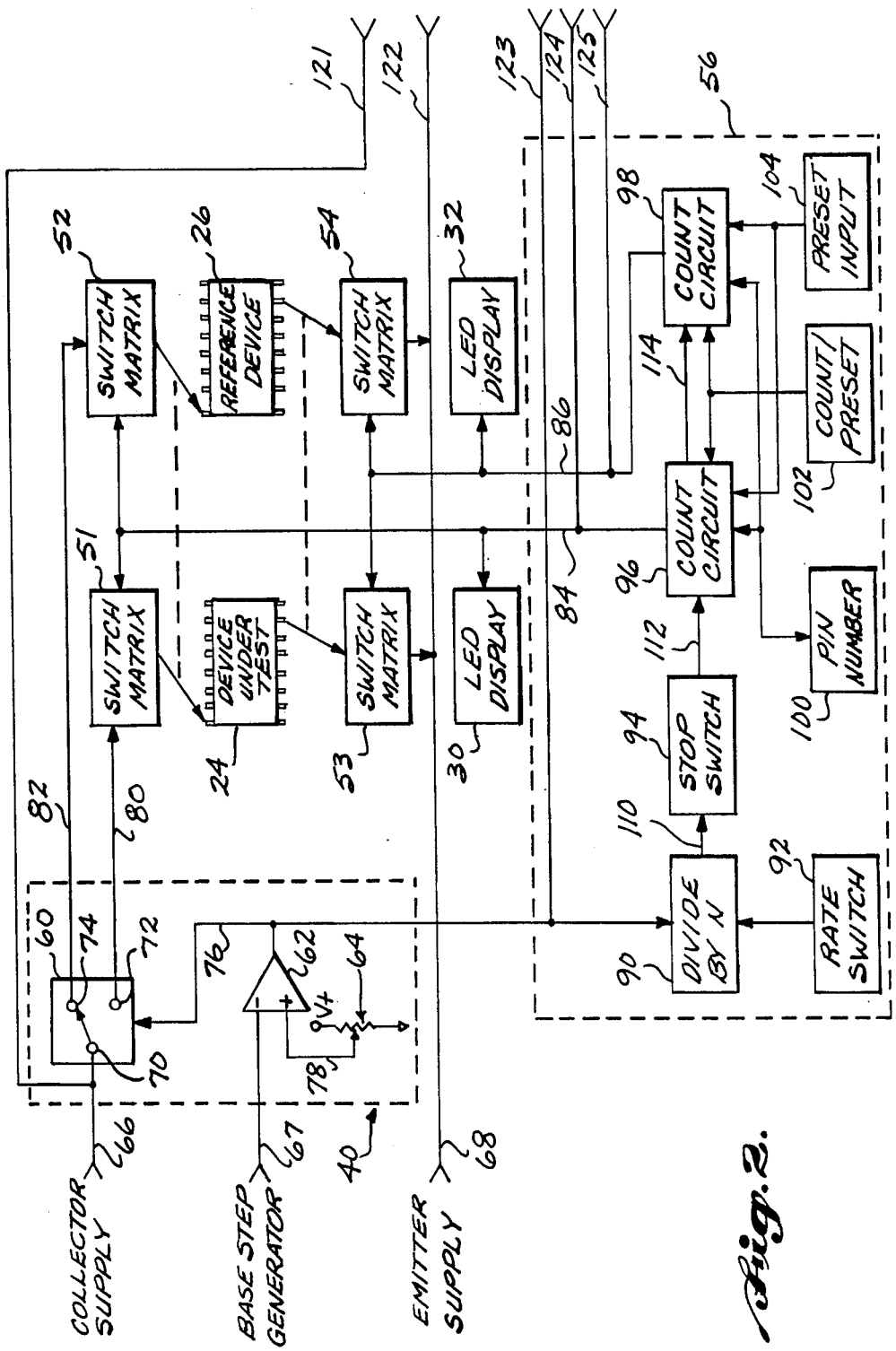
FIG. 2 is a block diagram of a first preferred embodiment of the accessory device of the present invention.

Referring now to FIG. 2, accessory device 10 includes device selection circuit 40, switch matrices 51-54, and pin number circuit 56. The accessory device also includes LED displays 30 and 32 that were described above in connection with FIG. 1. Device selection circuit 40 includes relay 60, comparator 62 and potentiometer 64. The device selector circuit receives signals from curve tracer 12 via lines 66 and 67. Line 66 is connected to the collector supply terminal of the curve tracer, and line 67 is connected to the base step generator terminal of the curve tracer. Line 68 of the accessory device is connected to the emitter supply terminal of the curve tracer. The curve tracer is adapted to display, on display screen 14, the voltage-current characteristic of the circuit connected between line 66 and line 68. The curve tracer is further adapted to provide a base step signal on line 67 that cyclically steps through a prescribed sequence of voltages.

Relay 60 includes input terminal 70 connected to line 66 and output terminals 72 and 74 connected to lines 80 and 82 respectively. The relay operates in response to a control signal provided by comparator 62 on line 76. Relay 60 is repeatedly switched back and forth, by alternation of the control signal, in order to alternately connect the collector supply terminal of the curve tracer to either line 80 or to line 82. When the collector supply terminal is connected to line 80, an electrical path is created from the collector supply terminal through switch matrix 51, device under test 24, and switch matrix 53, to the emitter supply terminal via line 68. The particular pins of device under test 24 that are coupled to lines 80 and 68, by switch matrices 51 and 53 respectively, are controlled by pin select signals provided by pin number circuit 56 on buses 84 and 86. In an analogous manner, when the collector supply terminal is connected to line 82 by relay 60, an electrical path is created from the collector supply terminal through switch matrix 52, reference device 26 and switch matrix 54, to the emitter supply terminal via line 68. Switch matrices 52 and 54 also operate in response to the pin select signals on buses 84 and 86 respectively, such that for given pin select signals, the electrical path through reference device 26 passes through the same pins as the electrical path through device under test 24.

Figure 3:
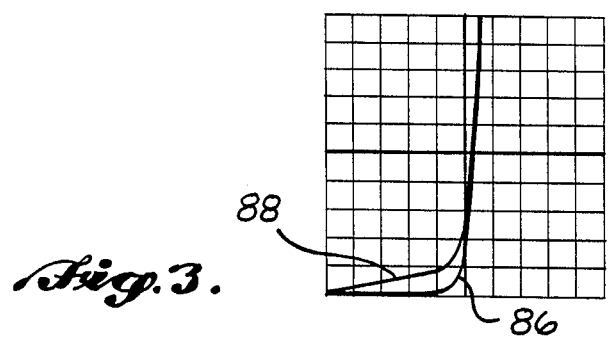
FIG. 3 depicts the display screen of a curve tracer using the accessory device of the present invention.

The effect of the described connections to device under test 24 and reference device 26, in connection with the switching back and forth of relay 60, is that the curve tracer "sees" two different devices connected between its collector supply terminal and emitter supply terminal. If the switching of relay 60 is sufficiently rapid, the result will be that two voltage/current characteristic curves will be simultaneously displayed on display screen 12, thereby enabling an operator to discern small and subtle differences between the characteristic curves. By way of example, FIG. 3 illustrates a display actually created on the screen of a curve tracer (Tektronics Model 576) by means of the present invention. In FIG. 3, curve 86 represents the voltage-current characteristic of a normal (properly working) p-n junction, while curve 88 represents the characteristic curve of a "leaky junction," i.e., a junction having a partial, resistive short between the p and n substrates, such that the junction exhibits excess current flow at low voltages. In FIG. 3, the origin (zero current and zero volts) is in the lower left-hand corner of the display, the horizontal scale is 100 millivolts per division, and the vertical scale is 50 microamperes per division. Those skilled in the art will appreciate that if curve 88 were viewed by itself, it would not be immediately apparent that the curve represented a defective p-n junction, inasmuch as the curve shape is generally similar to the shape of curve 86.

Referring again to FIG. 2, relay 60 is caused to switch back and forth between lines 80 and 82 by a control signal on line 76 that is generated by comparator 62. The negative input of comparator 62 is connected to the base step generator terminal of the curve tracer via line 67, and the positive input terminal of the comparator is connected to the wiper of potentiometer 64 via line 78. Potentiometer 64 is accessible to an operator via control panel 34 (FIG. 1). By appropriate adjustment of potentiometer 64 and of the base step generator controls on the curve tracer, the voltage on line 67 can be caused to fluctuate above and below the voltage on line 78, thereby switching the control signal on line 76 between high and low states. By way of example, the curve tracer could be adjusted such that the base step signal varied in one volt increments between one and four volt levels, and the potentiometer could be adjusted such that the voltage on line 78 was 2.5 volts. The signal on line 76 would therefore be a square wave having a 50 percent duty cycle. Such a signal would cause relay 60 to switch back and forth at a rate sufficient to create a single display on display screen 14 of the curve tracer.

As described above, switch matrix 51 operates to connect a selected pin of device under test 24 to line 80, while switch matrix 52 similarly operates to connect a selected pin of reference device 26 to line 82. Both switch matrices 51 and 52 operate in response to a common pin select signal on bus 84, such that the pin of device under test 24 that is connected to line 80 is at all times identical to the pin of reference device 26 connected to line 82. In a similar manner, switch matrices 53 and 54 operate under control of a pin select signal on bus 86, to connect the identical pins of device under test 24 and reference device 26 to line 68. The pin select signals on buses 84 and 86 are provided by pin number circuit 56. The pin number circuit comprises divide-by-N circuit 90, rate switch 92, stop switch 94, count circuits 96 and 98, pin number switch 100, count/preset switch 102, and preset input switches 104. Rate switch 92, stop switch 94, pin number switch 100, count/preset switch 102 and preset input switches 104 all represent switching elements that are accessible to an operator of the accessory device 10 via control panel 34 shown in FIG. 1.

Divide-by-N circuit 90 receives the control signal generated by comparator 62 on line 76, and provides an output signal on line 110 that has a frequency that is a factor of N less than the control signal. The value of N is set via rate switch 92. By way of example, divide-by-N circuit 90 could comprise a conventional binary counter in which the accumulated count is available on a series of output pins, such that the output pin signals represent $2^0$, $2^1$, $2^2$, etc. For such a counter, rate switch 92 could operate simply by connecting one of such output pins to output line 110. For example, if rate switch 92 connected the fourth ($2^3$) output pin of the counter to line 110, then the signal on line 110 would have a frequency of one-eighth of the control signal on line 76. An operator of the accessory device can therefore use rate switch 92 to control the frequency of the signal on line 110 up to a maximum frequency equal to the switching frequency of relay 60.

The signal on line 110 is input to stop switch 94, and the output of the stop switch on line 112 is input to a pair of interconnected count circuits 96 and 98. The function of stop switch 94 will be described below. For the purpose of the present description, assume that the switch is closed, such that the signals on lines 110 and 112 are identical. Count circuits 96 and 98 operate in conjunction with one another to provide the pin select signals on buses 84 and 86, respectively. The pin selection circuit 56 is adapted to operate in two modes, a preset mode and a count mode. The mode selection is made by an operator by means of count/preset switch 102. When the pin selection circuit is in the preset mode, the count values stored in count circuits 96 and 98 are supplied by the operator via preset input switches 104. By way of example, in an accessory device designed to accommodate integrated circuits having up to 64 pins, count circuits 96 and 98 would each comprise a six-bit counter. In the preset mode, the contents of count circuit 96 could be set by six individual switches of preset input 104, and the resulting six-bit number in the count circuit would be output directly onto bus 84. This six-bit number would be received by switch matrix 51, and used by the switch matrix to connect line 80 with the specified one of 64 pins of device under test 24. Switch matrix 52 would operate in an identical manner to connect line 82 to the same pin of reference device 26. The six-bit number in count circuit 98 would similarly be specified by a separate group of six switches of preset input 104, and would be output directly onto bus 86 for controlling switch matrices 53 and 54.

When the count mode is selected by an operator via count/preset switch 102, count circuits 96 and 98 operate to count pulses of the signal on line 112. The numbers stored in the count circuits are incremented in such a way that the accessory device cycles through all possible permutations of pin connections for device under test 24 and reference device 26. More particularly in the count mode the operator uses pin number switch 100 to specify the maximum number of pins of device under test 24 and reference device 26, i.e., the largest pin select signals to be provided on buses 84 and 86. For convenience, it may be desirable to limit the selections available through pin number switches 100 to values that are equal to powers of 2, i.e., 8, 16, 32 or 64. In such an embodiment, if the device under test and reference device each had 20 pins, the value 32 would be selected by pin number switch 100.

In the count mode, count circuit 96 directly counts the pulses of the signal on line 112. When the count in count circuit 96 equals the maximum pin number selected by pin number switch 100, count circuit 96 is reset to zero, and a "carry" signal is sent to count circuit 98 via line 114, thereby incrementing the count of count circuit 98 by one. This process continues until the count accumulated by count circuit 98 reaches the number specified by pin number switch 100, at which time both count circuits are reset to zero. As a result, all two-pin permutations of the device under test and the reference device are selected by the pin number circuit. The rate at which the accessory device cycles through pin permutations is set via rate switch 92, the rate switch operating to increase or decrease the frequency of the signal on line 112, as previously described. The cycling can be interrupted by the operator any time by opening stop switch 94, to thereby freeze the curve tracer display to more closely examine the characteristic curves of a given pin combination. At any time, the operator can leave the count mode via count/preset switch 102, and specify a given pin combination via preset input 104.

In the accessory device shown in FIG. 2, lines 121–123 and buses 124 and 125 are provided for connecting the accessory device to a linear integrated circuit tester such as the LTS-2010 tester available from Analog Devices. Lines 121 and 122 are connected to collector supply line 66 and emitter supply line 68 respectively, and buses 124 and 125 are connected directly to buses 84 and 86 respectively. Line 123 is connected to line 76, such that the integrated circuit tester can cause switching back and forth between device under test 24 and reference device 26.

Figure 4:
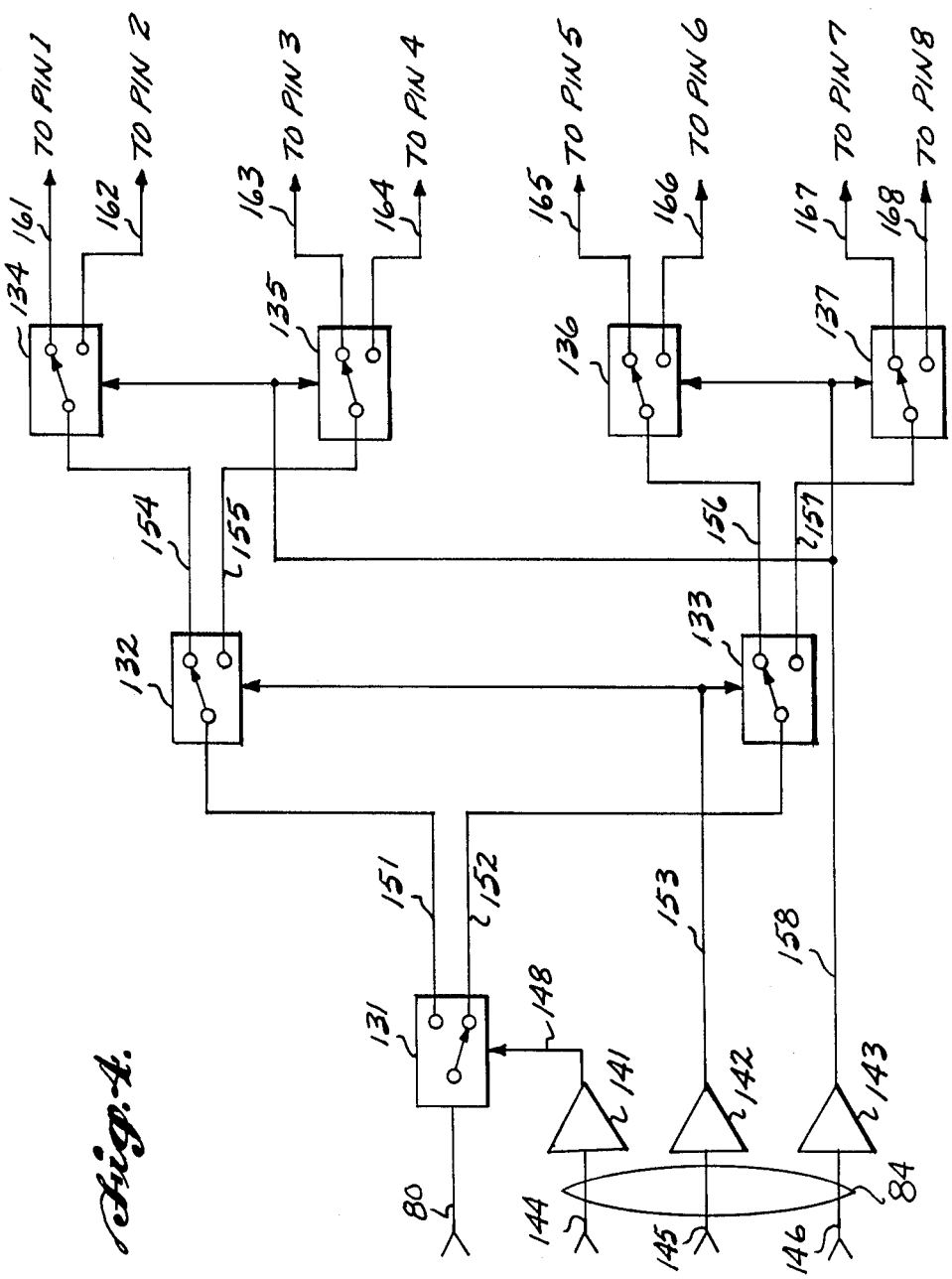
FIG. 4 is a circuit diagram of one of the switch matrices.

A preferred arrangement for switch matrix 51 is shown in FIG. 4, for an embodiment in which the switch matrix can connect the collector supply signal on line 80 to any one of eight pins of device under test 24. Switch matrices 52–54 may advantageously be made identical to switch matrix 51. An eight-way switch is illustrated in FIG. 4 for convenience, it being understood that in general, each switch matrix will provide for 16 or more alternate connections, to be compatible with widely used integrated circuit packages.

Switch matrix 51 of FIG. 4 comprises relays 131–137 and drivers 141–143. In the embodiment of FIG. 4, bus 84 comprises lines 144–146, and these lines are connected to the inputs of drivers 141–143 respectively. The signal on line 144 represents the most significant bit of the pin select signal, the signal on line 145 represents the next most significant bit of the pin select signal, and the signal on line 146 represents the least significant bit of the pin select signal. The signal on line 144 is connected via driver 141 to the control terminal of relay 131. Relay 131 connects the signal on line 80 to either line 151 or 152, depending on the control signal on line 148. It will be assumed for the present description that if the signal on line 144 is high, relay 131 connects lines 80 and 151, whereas if the signal on line 144 is low, relay 131 connects lines 80 and 152.

The signal on line 145 is connected via driver 142 and line 153 to the control terminals of relays 132 and 133. If the signal on line 153 is high, then relay 132 connects lines 151 and 154, and relay 133 connects lines 153 and 156. On the other hand, if the signal on line 153 is low, relay 132 connects line 151 to line 155 and relay 133 connects line 153 to line 157. In a similar manner, the signal on line 146 is coupled via driver 143 and line 158 to the control terminals of relays 134–137. These relays operate in a manner similar to relays 131–133, such that for any signal on bus 84, line 80 is interconnected by a series of three relays to one of output lines 161–168. Thus, by cycling the pin select signal on bus 84 between 0 through 7, line 80 will be sequentially connected to each of output lines 161–168, to sequentially connect pins 1 through 8 of the device under test to line 80.

In the embodiment shown in FIG. 4, the switch matrix is comprised of relays, and the voltage drop through the switch matrix is therefore negligible. However, the present invention may also be implemented with semiconductor switches such as junction field effect transistors (JFETs). When JFETs are used as the components of the switch matrices, there will be a significant voltage drop through the switch matrices. In such an embodiment, an arrangement such as the one shown in FIG. 5 would be used.

The embodiment of FIG. 5 includes relays 170 and 172 and switch matrices (SM) 181–188. Switch matrices 181–184 are controlled by the pin select signal on bus 84, and switch matrices 185–188 are controlled by the pin select signal on bus 86. In the embodiment of FIG. 5, for any given combination of pin select signals, there are two electrical paths through device under test 24, and two electrical paths through reference device 26. As in the embodiment of FIG. 2, a control signal is generated on line 76 that is synchronous with the base step signal. When the control signal is in a first state, relay 170 connects the collector supply terminal to line 191 and the collector sense terminal to line 192, and relay 172 connects the emitter supply terminal to line 201 and the emitter sense terminal to line 202. In this state, there is a first electrical path from the collector supply terminal, via switch matrix 184, reference device 26, switch matrix 188 and relay 172 to the emitter supply terminal, and a second conductive path from the collector sense terminal, through switch matrix 183, reference device 26, switch matrix 187 to the emitter sense terminal. Because of this arrangement, the current flowing through the reference device from the collector supply terminal to the emitter supply terminal, and the resulting voltage drop through switch matrices 184 and 188 resulting from that current, does not cause an erroneous measurement by the curve tracer, because the curve tracer is adapted to determine the voltage drop through the reference device by taking the difference between the voltages of the collector sense and emitter sense terminals. Because the curve tracer does not permit significant current flow between these terminals, there is negligible voltage drop in switch matrices 183 and 187, and an accurate voltage measurement is obtained.

When the control signal on line 76 is in its second state, relay 170 connects the collector supply terminal to line 193 and the collector sense terminal to line 194, and relay 172 connects the emitter supply terminal to line 203 and the emitter sense terminal to line 204. In this configuration, there are two electrical paths through the device under test, one through the collector and emitter supply terminals, and a second through the collector and emitter sense terminals, in a manner identical to that described above with respect to reference device 26. It should be noted in the embodiment of FIG. 5 that in most cases, lines 201 and 203 could be connected together to the emitter supply terminal of the curve tracer, thereby omitting the upper half of relay 172.

While the preferred embodiments of the invention have been illustrated and described, it should be understood that variations will be apparent to those skilled in the art. Accordingly, the invention is not to be limited to the specific embodiments illustrated and described, and the true scope and spirit of the invention are to be determined by reference to the following claims.

The embodiments of the invention in which an exclusive property or privilege is claimed are defined as follows:

1. An accessory device used in combination with a curve tracer that includes first, second and third terminals, means for providing a step signal at the second terminal such that the step signal cyclically takes on a plurality of voltage levels, and means for measuring and displaying, for each voltage level, the voltage-current characteristic of a device connected between the first and third terminals without requiring use of a storage type cathode ray tube, for comparing the voltage-current characteristic of one or more circuits of a test device with the voltage-current characteristic of one or more circuits of a reference device, the accessory device comprising:
   device selection means connected to receive the step signal and including means for alternately connecting the first terminal to either the test device or the reference device, in synchronization with the step signal so that the voltage-current characteristics of both the test and the reference devices are displayed simultaneously on the curve tracer; and
   means for connecting the third terminal to both the test and reference devices.

2. The accessory device of claim 1, further comprising pin selection means including means for producing a pin select signal representing a selected pin of the test circuit, and switch means connected in series with the test circuit such that a circuit path may be formed between the first and third terminals through the test circuit and switch means, the switch means being responsive to the pin select signal for switching said selected pin into said circuit path.

3. The accessory device of claim 1, further comprising pin selection means including means for producing a first and a second pin select signal representing a first and a second selected pins respectively of the test circuit, first switch means connected between the device selection means and the test circuit and responsive to the first pin select signal for connecting the device selection means to the first selected pin, and second switch means connected between the test circuit and the third terminal and responsive to the second pin select signal for connecting the second selected pin to the third terminal.

4. The accessory device of claim 3, wherein the pin selection means further comprise third switch means connected between the device selection means and the reference circuit and responsive to the first pin select signal for connecting the device selection means to the first selected pin of the reference circuit, and fourth switch means connected between the reference circuit and the third terminal and responsive to the second pin select signal for connecting the second selected pin of the reference circuit to the third terminal.

5. The accessory device of claim 1, wherein the device selection means include means for producing a control signal that alternates between first and second states such that the alternation between first and second states is synchronized with the step signal, and means responsive to the control signal for connecting the first terminal to a first output terminal when the control signal is in its first state, and for connecting the first terminal to a second output terminal when the control signal is in its second state, the first output terminal being coupled to the test device and the second output terminal being coupled to the reference device.

6. The accessory device of claim 5, wherein the means for producing the control signal comprise means for comparing the step signal to a selected voltage level.

7. The accessory device of claim 5, further comprising pin selection means including means for producing a pin select signal representing a selected pin of the test circuit, and switch means connected in series with the test circuit such that a circuit path may be formed between the first output terminal and the third terminal through the test circuit and switch means, the switch means being responsive to the pin select signal for switching said selected pin into said circuit path.

8. The accessory device of claim 7, wherein the pin selection means are connected to receive the control signal, and include means for modifying the pin select signal, to thereby change the selected pin, for each N cycles of the control signal that are received, N being a preselected number greater than or equal to one.

9. The accessory device of claim 5, further comprising pin selection means, including means for producing first and second pin select signals representing first and second selected pins respectively of the test circuit, first switch means connected between the first output terminal and the test circuit and responsive to the first pin select signal for connecting the first output terminal to the first selected pin, and second switch means connected between the test circuit and the third terminal and responsive to the second pin select signal for connecting the second selected pin to the third terminal.

10. The accessory device of claim 9, wherein the pin selection means are connected to receive the control signal, and include means for modifying at least one of the pin select signals, to thereby change at least one of the selected pins, for each N cycles of the control signal that are received, N being a preselected number greater than or equal to one.

11. The accessory device of claim 10, wherein the pin selection means include a divide-by-N counter for receiving the control signal and producing a modified control signal having a frequency that is a factor of N less than the frequency of the control signal, a first count circuit connected to receive the modified control signal and count the cycles thereof, the output of the first count circuit comprising the first pin select signal, and a second count circuit connected to the first count circuit and adapted to increment its count each time that the first count circuit counts up to a predetermined maximum value, the output of the second count circuit comprising the second pin select signal.

12. The accessory device of claim 9, wherein the pin selection means further comprise third switch means connected between the second output terminal and the reference circuit and responsive to the first pin select signal for connecting the second output terminal to the first selected pin of the reference circuit, and fourth switch means connected between the reference circuit and the third terminal and responsive to the second pin select signal for connecting the second selected pin of the reference circuit to the third terminal.

13. The accessory device of claim 1, wherein the accessory device is used in combination with a curve tracer that further includes fourth and fifth terminals and means for measuring and displaying, for each voltage level, the current between the first and third terminals as a function of the voltage between the fourth and fifth terminals;

the device selection means including means for alternately connecting the first, fourth and fifth terminals to either the test device or the reference device, the alternation between test and reference devices being synchronized with the step signal; and the accessory device further comprising pin selection means including means for producing a pin select signal representing a selected pin of the test circuit, first sense switch means connected in series with the test circuit such that a sense circuit path may be formed between the fourth and fifth terminals through the test circuit and first sense switch means, first supply switch means connected in series with the test circuit such that a supply circuit path may be formed between the first and third terminals through the test circuit and first supply switch means, the first sense and first supply switch means both being responsive to the pin select signal for switching the selected pin into the sensing and supply circuit paths respectively.

14. The accessory device of claim 13, wherein the pin selection means further comprise second sense switch means connected in series with the reference circuit such that a sense circuit path is formed between the fourth and fifth terminals through the reference circuit and second sense switch means, and second supply switch means connected in series with the reference circuit such that a supply circuit path is formed between the first and third terminals through the reference circuit and second supply switch means, the second sense and second supply switch means both being responsive to the pin select signal for switching said selected pin into the sensing and supply circuit paths respectively.

15. The accessory device of claim 14, wherein the device selection means include means for producing a control signal that alternates between first and second states such that the alternation between first and second states is synchronized with the step signal, and means responsive to the control signal for connecting each of the first, fourth and fifth terminals to a corresponding first output terminal when the control signal is in its first state, and for connecting each of the first, fourth and fifth terminals to a corresponding second output terminal when the control signal is in its second state, the first output terminals being coupled to the test device and the second output terminals being coupled to the reference device.

16. The accessory device of claim 15, wherein the means for producing the control signal comprise means for comparing the step signal to a selected voltage level.

17. The accessory device of claim 16, wherein the pin selection means are connected to receive the control signal, and include means for modifying the pin select signal, to thereby change the selected pin, for each N cycles of the control signal that are received, N being a preselected number greater than or equal to one.

18. The accessory device of claim 15, wherein the pin selection means further include means for producing a first and a second pin select signal, representing a first and a second selected pins respectively, of the test circuit, and wherein the first supply switch means and the first sense switch means are operative in response to the first pin select signal, to connect the first output terminals corresponding to the first and fourth terminals to the first selected pin of the test circuit, and in response to the second pin select signal, to connect the third terminal and the first output terminal corresponding to the fifth terminal to the second selected pin of the test circuit.

19. The accessory device of claim 18, wherein the pin selection means is connected to receive the control signal, and includes means for modifying at least one of the pin select signals, to thereby change at least one of the selected pins, for each N cycles of the control signal that are received, N being a preselected number greater than or equal to one.

20. The accessory device of claim 19, wherein the pin selection means includes a divide-by-N counter for receiving the control signal and producing a modified control signal having a frequency that is a factor of N less than the frequency of the control signal, a first count circuit connected to receive the modified control signal and count the cycles thereof, the output of the first count circuit comprising the first pin select signal, and a second count circuit connected to the first count circuit and adapted to increment its count each time that the first count circuit counts up to a predetermined maximum value, the output of the second count circuit comprising the second pin select signal.

21. The accessory device of claim 18, wherein the first and the second pin select signals also represent a first and a second selected pin respectively, of the reference circuit and wherein the second supply switch means and second sense switch means are operative in response to the first pin select signal, to connect the second output terminals corresponding to the first and fourth terminals to the first selected pin of the reference circuit, and in response to the second pin select signal, to connect the third terminal and the second output terminal corresponding to the fifth terminal to the second selected pin of the reference circuit.

* * * * *